(12) United States Patent
Emami et al.

(10) Patent No.: US 6,432,826 B1
(45) Date of Patent: Aug. 13, 2002

(54) PLANARIZED CU CLEANING FOR REDUCED DEFECTS

(75) Inventors: Ramin Emami, San Jose; Shijian Li, Santa Clara; Sen-Hou Ko, Cupertino; Fred C. Redeker, Fremont; Madhavi Chandrachood, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/450,479

(22) Filed: Nov. 29, 1999

(51) Int. Cl.[7] ............................................. H01L 21/302
(52) U.S. Cl. ....................... 438/692; 438/693; 438/694; 438/750; 438/754; 216/88; 216/89; 216/105; 134/1.3
(58) Field of Search ............................ 216/88, 89, 105; 438/692, 693, 750, 754, 694; 134/1.3

(56) References Cited

U.S. PATENT DOCUMENTS

| | | | |
|---|---|---|---|
| 4,169,337 A | 10/1979 | Payne | 51/283 R |
| 4,588,421 A | 5/1986 | Payne | 51/308 |
| 4,752,628 A | 6/1988 | Payne | 523/122 |
| 4,867,757 A | 9/1989 | Payne | 51/293 |
| 5,264,010 A | 11/1993 | Brancaleoni et al. | 51/308 |
| 5,614,444 A | 3/1997 | Farkas et al. | 437/225 |
| 5,662,769 A | 9/1997 | Schonauer et al. | 438/633 |
| 5,700,383 A | 12/1997 | Feller et al. | 216/88 |
| 5,738,574 A | 4/1998 | Tolles et al. | 451/288 |
| 5,738,800 A | 4/1998 | Hosali et al. | 216/99 |
| 5,756,398 A | 5/1998 | Wang et al. | 438/692 |
| 5,769,689 A | 6/1998 | Cossaboon et al. | 451/41 |
| 5,840,629 A | 11/1998 | Carpio | 438/692 |
| 5,876,508 A | 3/1999 | Wu et al. | 134/2 |
| 5,911,835 A * | 6/1999 | Lee et al. | 134/1.3 |
| 5,932,486 A | 8/1999 | Cook et al. | 438/692 |
| 5,958,794 A | 9/1999 | Bruxvoort et al. | 438/692 |
| 5,981,454 A | 11/1999 | Small | 510/175 |

(List continued on next page.)

FOREIGN PATENT DOCUMENTS

| | | |
|---|---|---|
| EP | 0 620 293 A | 10/1994 |
| EP | 0 859 407 A | 8/1998 |
| EP | 0 913 442 A2 | 5/1999 |
| FR | 2722511 | 1/1996 |
| WO | 93/10277 | 5/1993 |
| WO | WO 98/49723 | 11/1998 |
| WO | WO 99/46353 | 9/1999 |
| WO | WO 00/30159 | 5/2000 |
| WO | WO 00/36037 | 6/2000 |
| WO | WO 00/49647 | 8/2000 |
| WO | WO 00/53691 | 9/2000 |
| WO | 00/59029 | 10/2000 |

OTHER PUBLICATIONS

Brusic, V. et al., "Copper Corrosion With and Without Inhibitors," *Electrochem. Soc.*, 138:8, 2253–2259, Aug. 1991.

EPO Search Report for EP No. 00310448.2, dated Apr. 18, 2001.

*Primary Examiner*—George Goudreau
(74) *Attorney, Agent, or Firm*—Moser, Patterson & Sheridan

(57) ABSTRACT

Cu metallization is treated to reduce defects and effect passivation by removing a thin surface layer or removing corrosion stains, subsequent to CMP and barrier layer removal, employing a cleaning composition comprising deionized water, an acid and ammonium hydroxide and/or an amine. Embodiments include removing up to about 100 Å of the Cu metallization surface in a damascene opening by sequentially treating the exposed Cu surface with: an optional corrosion inhibitor; a solution having a pH of about 4 to about 11 and containing an acid, ammonium hydroxide and/or an amine, and deionized water; and a corrosion inhibitor.

30 Claims, 2 Drawing Sheets

U.S. PATENT DOCUMENTS

| | | | |
|---|---|---|---|
| 6,033,993 A | 3/2000 | Love, Jr. et al. | 438/745 |
| 6,042,741 A | 3/2000 | Hosali et al. | 252/79.1 |
| 6,046,110 A | 4/2000 | Hirabayashi et al. | 438/693 |
| 6,054,379 A | 4/2000 | Yau et al. | 438/623 |
| 6,068,879 A * | 5/2000 | Pasch | 427/97 |
| 6,074,949 A | 6/2000 | Schonauer et al. | 438/692 |
| 6,077,337 A | 6/2000 | Lee | 106/3 |
| 6,083,840 A * | 7/2000 | Mravic et al. | 438/693 |
| 6,096,652 A | 8/2000 | Watts et al. | 438/692 |
| 6,117,775 A * | 9/2000 | Kondo et al. | 438/690 |
| 6,117,783 A | 9/2000 | Small et al. | 438/693 |
| 6,123,088 A | 9/2000 | Ho | 134/1.3 |
| 6,156,661 A | 12/2000 | Small | 438/692 |
| 6,162,301 A | 12/2000 | Zhang et al. | 134/3 |
| 6,165,956 A | 12/2000 | Zhang et al. | 510/175 |

* cited by examiner

PLANARIZED CU CLEANING FOR REDUCED DEFECTS

TECHNICAL FIELD

The present invention relates to copper (Cu) and/or Cu alloy metallization in semiconductor devices with improved planarity and reduced defects. The present invention is applicable to manufacturing high speed integrated circuits having submicron design features and high conductivity interconnect structures with improved reliability.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance and capacitance) interconnect pattern, particularly wherein submicron vias, contacts and trenches have high aspect ratios imposed by miniaturization.

Conventional semiconductor devices comprise a semiconductor substrate, typically doped monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the dielectric interlayer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section. The entire opening is filled with a conductive material, typically a metal, to simultaneously form a conductive plug in electrical contact with a conductive line.

Cu and Cu alloys have received considerable attention as a candidate for replacing Al in interconnect metallizations. Cu is relatively inexpensive, easy to process, and has a lower resistivity than Al. In addition, Cu has improved electrical properties, vis-a-vis W, making Cu a desirable metal for use as a conductive plug as well as conductive wiring.

An approach to forming Cu plugs and wiring comprises the use of damascene structures.

However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), titanium-titanium nitride (Ti-TiN), titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In conventional CMP techniques, a wafer carrier assembly is rotated in contact with a polishing pad in a CMP apparatus. The polishing pad is mounted on a rotating turntable or platen, or moving above a stationary polishing table, driven by an external driving force. The wafers are typically mounted on a carrier or polishing head which provides a controllable pressure urging the wafers against the polishing pad. Thus, the CMP apparatus effects polishing or rubbing movement between the surface of each thin semiconductor wafer and the polishing pad while dispersing a polishing chemical with or without abrasive particles in a reactive solution to effect both chemical activity and mechanical activity while applying a force between the wafer and a polishing pad.

It is extremely difficult to planarize a Cu surface, as by CMP of a damascene inlay, without generating a high degree of surface defects, such as corrosion, scratches, pitting and embedded abrasive particles. A dense array of Cu features is typically formed in an interlayer dielectric, such as a silicon oxide layer, by a damascene technique wherein trenches are initially formed. A barrier layer, such as a Ta-containing layer e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. CMP is then conducted to remove the Cu or Cu alloy overburden stopping on the barrier layer followed by buffing, employing a mixture of a chemical agent and abrasive particles, to remove the barrier layer, or conducting CMP directly down to the interlayer dielectric. Buffing is optionally conducted on the interlayer dielectric surface, leaving a Cu or the Cu alloy filling the damascene opening with an exposed surface having a high concentration of defects. These defects include corrosion, e.g., corrosion stains, microscratches, micropitting and surface abrasive particles. Cu and Cu alloy wafers exhibit a much greater tendency to scratch during planarization than dielectric materials, such as oxides or nitrides. Cu and Cu alloy surfaces corrode very easily and are difficult to passivate in high or low pH aqueous environments. Conventional wafer cleaning alone cannot completely eliminate such defects. Conventional practices for planarizing Cu or Cu alloys disadvantageously result in a high defect count subsequent to planarization. Such surface defects adversely impact device performance and reliability, particularly as device geometries shrink into the deep sub-micron range.

There exists a need for methodology enabling the planarization of Cu and Cu alloys with a significantly reduced surface defect count. There exists a further need for such enabling methodology that is compatible with conventional CMP and buffing techniques and apparatuses.

DISCLOSURE OF THE INVENTION

An aspect of the present invention is an efficient method of planarizing Cu and Cu alloys with significantly reduced surface defects.

Additional aspects and other features of the present invention will be set forth in part in the description which follows and in part will become apparent to those having ordinary skill in the art upon examination of the following or may be learned from the practice of the present invention. The aspects of the present invention may be realized and obtained as particularly pointed out in the appended claims.

According to the present invention, the foregoing and other aspects are implemented in part by a method of planarizing a wafer surface containing: an interlayer dielectric having an upper surface and at least one opening, a barrier layer lining the opening and on the upper surface of the interlayer dielectric; and copper (Cu) or a Cu alloy filling the opening and on the interlayer dielectric; the method comprising the sequential steps of. removing the Cu or Cu alloy layer and the barrier layer leaving an exposed surface of Cu or Cu alloy in the opening containing defects; and chemically treating the exposed surface of Cu or Cu alloy to reduce the number of defects in the exposed surface. Embodiments of the present invention include planarizing by CMP to remove the Cu and Cu alloy layer and barrier layer, or CMP to remove the Cu or Cu alloy layer stopping on the barrier layer followed by buffing to remove the barrier layer. In addition, the upper surface of the exposed Cu metallization can be buffed for initial defect reduction in accordance with embodiments of the present invention subsequent to removing the barrier layer.

Another aspect of the present invention is a method of treating a surface comprising Cu or a Cu alloy, the method comprising the sequential steps of applying to the surface of the Cu or Cu alloy: a solution having a pH of about 4 to about 11 comprising deionized water, an acid and ammonium hydroxide and/or an amine; and a corrosion inhibitor. A corrosion inhibitor can optionally be applied to the Cu or Cu alloy prior to applying the solution comprising deionized water, an acid and ammonium hydroxide and/or an amine. Embodiments of the present invention include treating the exposed surface of the Cu or Cu alloy layer to remove a thin layer of exposed Cu or to remove corrosion stains, typically comprising copper oxide and/or corrosion by-products. Suitable treating solutions include deionized water, an inorganic and/or organic acid, such as citric acid, and ammonium hydroxide and/or an amine such as ethylenediamine. Suitable compositions include up to about 26 weight percent of an acid, e.g., citric acid, up to about 5 wt. % of ammonium hydroxide and/or an amine, and deionized water. A particularly suitable composition comprises about 5 to about 7 wt. % citric acid, about 0.5 to about 1.0 wt. % ammonium hydroxide, the remainder deionized water.

Embodiments of the present invention include forming an interconnection structure comprising openings in a silicon oxide interlayer dielectric lined with a barrier layer, such as a Ta-containing barrier layer, e.g., Ta or TaN, and filled with Cu or a Cu alloy, and treating the exposed upper surface of the Cu or Cu alloy to remove surface defects and effect passivation. Embodiments of the present invention further include removing up to about 100 Å from the Cu or Cu alloy surface and passivating the cleaned surface by sequential treatment with: an optional corrosion inhibitor in deionized water; a solution comprising citric acid, ammonium hydroxide and deionized water; and a corrosion inhibitor in deionized water. Advantageously, the last step of treating with a corrosion inhibitor is conducted while removing or separating the wafer from the polishing pad or belt.

Additional aspects of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
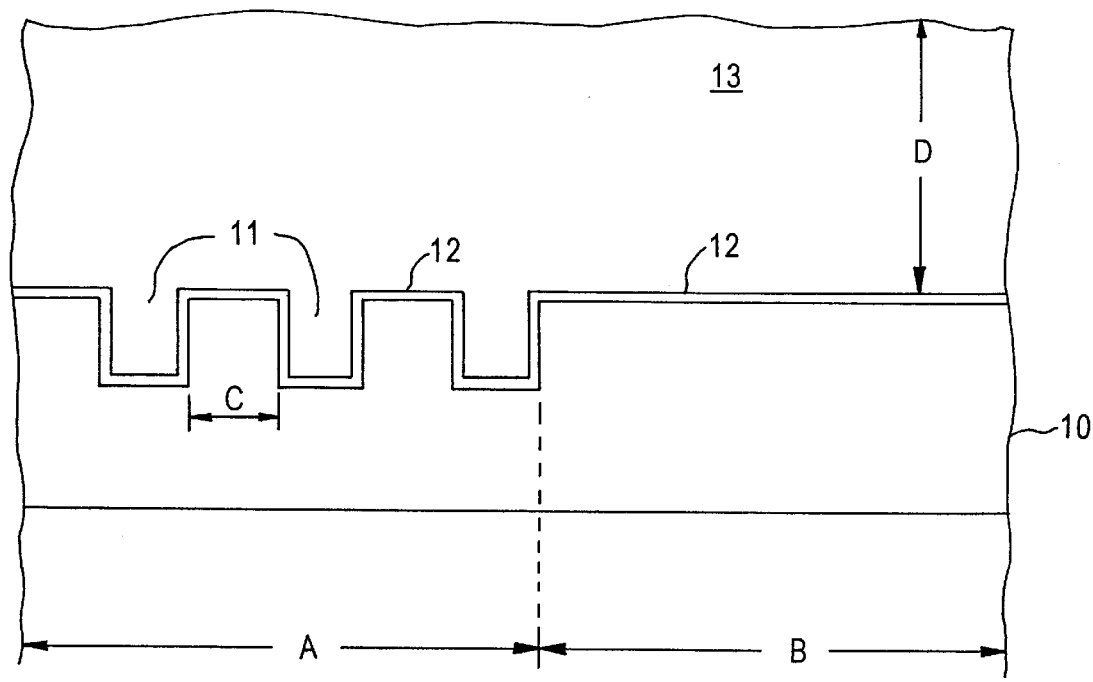
FIGS. 1–4 illustrate sequential phases of a method in accordance with an embodiment of the present invention.

The present invention enables effective and efficient planarization of Cu metallization with significantly reduced defects, such as corrosion, scratches, pitting and embedded abrasive particles, consistent with the ever increasing demands for reliable interconnect patterns having feature sizes in the deep submicron range. As used throughout this disclosure, the symbol Cu is intended to encompass high purity elemental copper as well as copper-based alloys, e.g., copper-based alloys containing at least about 80 at .% copper.

The objectives of the present invention are achieved by employing a strategic multi-step process subsequent to CMP and barrier layer removal. The multi-step methodology of the present invention effects cleaning of the surface of the inlaid Cu metallization containing defects generated during CMP and barrier layer removal leaving a relatively defect-free, passivated surface. Such cleaning can comprise removing a thin surface layer of the inlayed Cu metallization and/or removing corrosion stains, typically copper oxide and/or copper hydroxide mixed with corrosion by-products. The multi-step methodology of the present invention comprises treating the exposed surface of Cu metallization after barrier layer removal by sequentially applying: an optional corrosion inhibitor in deionized water; a solution comprising an acid, e.g., citric acid, ammonium hydroxide and/or an amine, and deionized water; and a corrosion inhibitor in deionized water.

The exact mechanism underpinning the reduction of defects and surface passivation achieved by the present invention is not known with certainty. However, it is believed that the sequential treatment in accordance with the present invention subsequent to barrier layer removal removes a thin layer of the surface of the Cu metallization containing defects and/or removes corrosion stains leaving a relatively defect free surface, and promptly passivates the relatively defect free surface to avoid the generation of further defects. It is believed that the optional initial treatment with a corrosion inhibitor and deionized water reduces corrosion, particularly corrosion induced by an abrasive slurry used on the surface of the Cu metallization. Corrosion, unlike static etching, is non-uniform and, hence, should be avoided.

The optional initial treatment with a corrosion inhibitor can comprise the use of any of various corrosion inhibitors, such as benzotriazole (BTA) or 5-methyl-1-benzotriazole (TTA), for about 3 seconds to about 10 seconds, e.g., about 5 seconds. It is believed that the subsequent treatment with the solution containing deionized water, an acid, e.g., citric acid, or acetic acid and ammonium hydroxide and/or an amine effects removal of up to about 100 Å of the surface of the Cu metallization and/or corrosion stains, generated by surface corrosion, microscratching and pitting, leaving a substantially defect free surface. This surface treatment can be conducted for about 10 seconds to about 20 seconds. It is believed that the final treatment with a corrosion inhibitor, such as TTA in deionized water, protects the surface during de-chucking and provides a passivated surface layer protecting the substantially defect-free surface of the Cu metallization from attack by dissolved oxygen.

Embodiments of the present invention include removing the Cu overburden and barrier layer in any of various conventional manners. For example, the Cu overburden and barrier layer can be removed during a single stage CMP technique, or the Cu overburden can be initially removed by CMP followed by buffing to remove the barrier layer. In either case, the exposed surface of the Cu metallization can be subjected to an additional buffing step to remove defects prior to performing the multi-step procedure of the present invention. CMP of the Cu and barrier layer buffing can be implemented in a conventional manner.

Conventional substrates and interlayer dielectrics are encompassed by the present invention. For example, the substrate can be doped monocrystalline silicon or gallium-arsenide. The interlayer dielectric can comprise any of various dielectric materials conventionally employed in the manufacture of semiconductor devices. For example, dielectric materials, such as silicon dioxide, phosphorus-doped silicon glass (PSG), boron- and phosphorous-doped silicon glass (BPSG) and silicon dioxide derived from tetraethyl orthosilicate (TEOS) or silane by plasma enhanced chemical vapor deposition (PECVD) can be employed. Interlayer dielectrics in accordance with the present invention can also comprise low dielectric constant materials, including polymers, such as polyimides, and carbon-containing silicon dioxide, e.g., Black Diamond dielectric available from Applied Materials, Inc., located in Santa Clara, Calif. The openings are formed in interlayer dielectrics by conventional photolithographic and etching techniques.

An embodiment of the present invention is schematically illustrated in FIGS. 1–4, wherein similar features bear similar reference numerals. Adverting. to FIG. 1, interlayer dielectric 10, e.g., silicon oxide, is formed overlying a substrate (not shown). A plurality of openings 11 are formed in a designated area A in which a dense array of conductive lines are to be formed bordering an open field B. A barrier layer 12, e.g., TaN, is deposited lining the openings 11 and on the upper surface of silicon oxide interlayer dielectric 10. Typically, the openings 11 are spaced apart by a distance C which is less than about 1 micron, e.g., about 0.2 micron. Cu layer 13 is then deposited at a thickness D of about 8,000 Å to about 18,000 Å.

Figure 2:
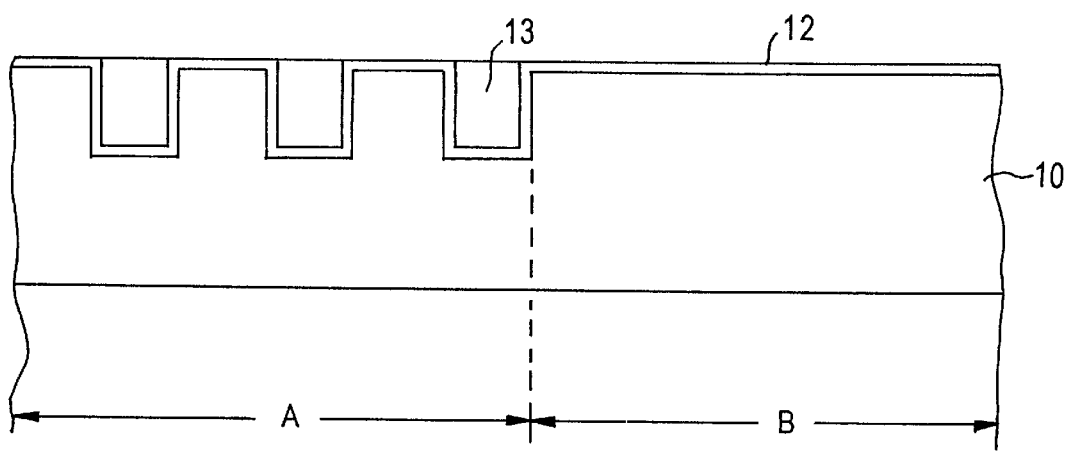
Figure 3:
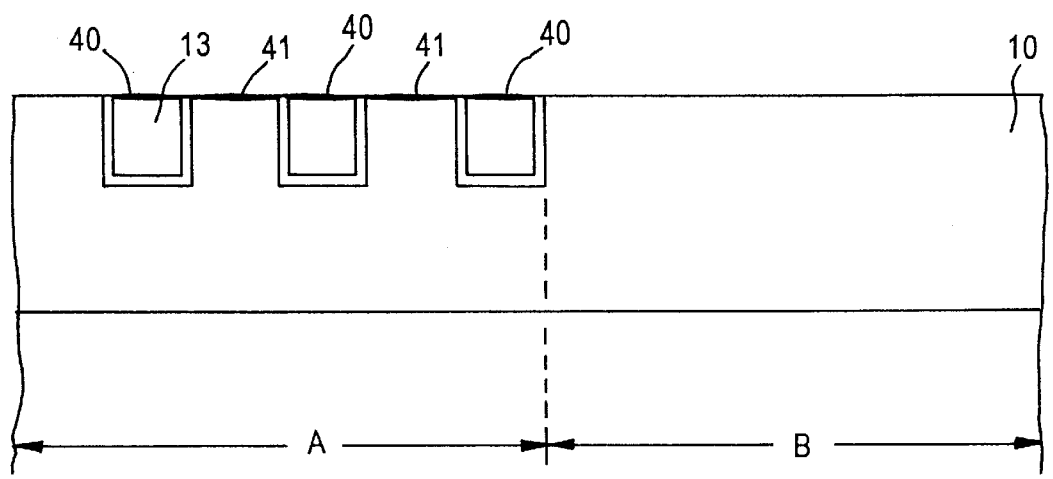

Adverting to FIGS. 1 and 2, CMP is initially conducted in a conventional manner to remove the Cu overburden stopping on TaN barrier layer 12. As shown in FIGS. 2 and 3, buffing is conducted in a conventional manner to remove TaN layer 12. The resulting Cu interconnection structure comprises a dense array A of Cu lines 13 bordered by open field B.

However, the upper surface 40 of the Cu metallization and the dielectric surface 41 exhibit an unacceptably high defect count, e.g., at best 750 defects, comprising primarily corrosion stains, microscratches, micropits and abrasive slurry particles as measured on an ORBOT® available from Applied Materials, Inc. of Santa Clara, Calif.

In accordance with the present invention, the Cu metallization surface 40 and dielectric surface 41 are treated by a multi-step procedure comprising sequentially applying an optimal solution of a corrosion inhibitor, followed by a solution comprising deionized water, an acid and ammonium hydroxide and/or an amine, and then applying a solution of a corrosion inhibitor. The optional initial treatment with a corrosion inhibitor can comprise deionized water and about 0.01 to about 0.50 wt. %, e.g., about 0.05 wt. %, of a corrosion inhibitor, such as BTA or TTA, for about 3 to about 10 seconds, e.g., about 5 seconds. The next treatment step is then performed employing, for example, a solution comprising up to about 26 wt. % of an acid, e.g., about 5 to about 7 wt. % citric acid, up to about 5 wt. % of ammonium hydroxide and/or an amine, e.g., about 0.5 to about 1.0 wt. % ammonium hydroxide, the remainder deionized water, for a suitable period of time, e.g., for about 10 seconds to about 30 seconds.

Figure 4:
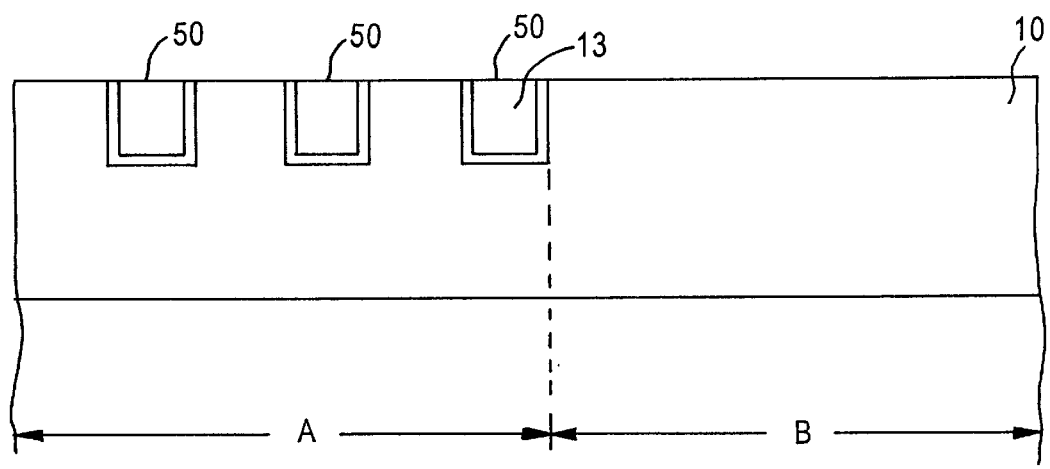

Subsequently, the wafer is de-chucked while applying thereto a corrosion inhibitor, such as TTA or BTA in deionized water. The sequential treatment with an optional corrosion inhibitor, followed by cleaning with a solution comprising an acid, ammonium hydroxide and/or an amine and deionized water, and de-chucking with a corrosion inhibitor, effectively removes a defective upper surface of the Cu metallization 40 and dielectric surface 41 leaving a relatively defect-free passivated surface 50, as shown in FIG. 4. Experiments conducted employing the inventive procedure resulted in a planarized Cu metallization having a surface with a defect count less than 139, even less than 100, as measured on an ORBOT®.

The present invention is applicable to planarizing a wafer surface during various stages of semiconductor manufacturing employing any of various types of CMP systems. The present invention enjoys particular applicability in the manufacture of high density semiconductor devices with metal features in the deep submicron range.

Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

What is claimed is:

1. A method of treating a substrate surface comprising copper containing material, the method comprising:
   disposing a substrate on a polishing platen;
   polishing the substrate surface;
   treating the substrate surface with a first corrosion inhibitor;
   applying to the substrate surface a solution having a pH of about 4 to about 11, comprising deionized water, an acid and ammonium hydroxide and/or an amine; and then
   applying a second corrosion inhibitor in situ to the substrate disposed on the platen.

2. The method according to claim 1, wherein the first corrosion inhibitor comprises about 0.01 to about 0.50 wt. % of benzotriazole or 5-methyl-1-benzotriazole and deionized water.

3. The method according to claim 1, wherein the solution comprises up to about 26 wt. % of an acid, up to about 5 wt. % of ammonium hydroxide and/or an amine, and the remainder comprises deionized water.

4. The method according to claim 1, wherein the solution comprises citric acid, ammonium hydroxide and deionized water.

5. The method according to claim 4, wherein the solution comprises up to about 26 wt. % citric acid, up to about 5 wt.

% ammonium hydroxide, and the remainder comprises deionized water.

6. The method according to claim 5, wherein the solution comprises about 5 to about 7 wt. % citric acid and about 0.5 to about 1.0 wt. % ammonium hydroxide.

7. The method according to claim 1, wherein the first corrosion inhibitor is applied for about 3 to about 10 seconds prior to treating the substrate surface with the solution.

8. The method according to claim 5, wherein the solution is applied for about 10 to about 20 seconds.

9. The method according to claim 5, wherein the solution is applied to remove a portion of the substrate surface comprising copper containing material or to remove corrosion stains from the copper containing material.

10. The method according to claim 9, wherein the solution is applied to remove the portion of the substrate surface comprising copper containing material at a removal rate of about 10 to about 200 Å per minute.

11. The method according to claim 1, wherein the second corrosion inhibitor solution is applied for about 3 to about 10 seconds.

12. A method of planarizing a wafer surface containing:
   an interlayer dielectric having an upper surface and at least one opening;
   a barrier layer lining the opening and on the upper surface of the interlayer dielectric; and
   copper containing material filling the opening and on the interlayer dielectric; the method comprising:
   removing the copper containing material layer and the barrier layer leaving an exposed surface comprising copper containing material in the opening containing defects; and
   chemically treating the exposed surface comprising copper containing material to reduce the number of defects in the exposed surface, wherein chemically treating the exposed surface comprises:
      disposing a substrate on a polishing platen;
      chemical-mechanical polishing (CMP) the surface to remove the copper containing material layer;
      applying a first corrosion inhibitor to the copper containing material surface;
      applying to a surface of the copper containing material a solution having a pH of about 4 to about 11, comprising deionized water, an acid and ammonium hydroxide and/or an amine; and then
      applying a second corrosion inhibitor in situ to the substrate disposed on the platen.

13. The method according to claim 12, further comprising buffing the exposed surface after removing the copper containing material layer and prior to chemically treating the exposed surface.

14. The method according to claim 12, wherein the method comprises:
   CMP to remove the copper containing material layer stopping on the barrier layer;
   buffing to remove the barrier layer leaving the exposed surface comprising copper containing material layer in the opening containing defects.

15. The method according to claim 12, wherein the method comprises CMP to remove the copper containing material layer and the barrier layer leaving the exposed surface comprising copper containing material layer in the opening containing defects.

16. The method according to claim 12, wherein:
   the interlayer dielectric comprises a silicon oxide; and
   the barrier layer comprises tantalum (Ta) or tantalum nitride (TaN).

17. The method according to claim 12, wherein chemically treating the exposed surface comprising copper containing material layer to reduce the number of defects in the exposed surface comprises removing a portion of the surface of the copper containing material or removing corrosion stains from the copper containing material surface.

18. The method according to claim 17, wherein up to about 100 Å of the copper containing material is removed from the exposed surface comprising Cu or the Cu alloy.

19. The method according to claim 12, wherein the solution comprises deionized water, citric acid and ammonium hydroxide.

20. The method according to claim 12, wherein chemically treating the exposed surface comprises:
   mounting the wafer on a carrier in a CMP apparatus;
   CMP the wafer using a polishing pad;
   applying the first corrosion inhibitor and applying the solution; and
   applying the second corrosion inhibitor after polishing the substrate surface while separating the wafer from the polishing pad.

21. The method according to claim 12, wherein the first corrosion inhibitor comprises about 0.01 to about 0.50 wt. % of benzotriazole or 5-methyl-1-benzotriazole and deionized water.

22. The method according to claim 12, wherein the solution comprises up to about 26 wt. % of the acid, up to about 5 wt. % of ammonium hydroxide and/or an amine, and the remainder comprises deionized water.

23. The method according to claim 22, wherein the solution comprises about 5 to about 7 wt. % citric acid, about 0.5 to about 1.0 wt. % ammonium hydroxide, and the remainder comprises deionized water.

24. The method according to claim 21, wherein the first corrosion inhibitor is applied for about 3 to about 10 seconds prior to treating the substrate surface with the solution and after polishing the substrate surface.

25. The method according to claim 22, wherein the solution is applied for about 10 to about 30 seconds.

26. The method according to claim 17, wherein the solution removes a thin layer of the substrate surface at a removal rate of about 10 to about 200 Å per minute.

27. The method according to claim 1, wherein the second corrosion inhibitor comprises about 0.01 to about 0.50 wt. % of benzotriazole or 5-methyl-1-benzotriazole and deionized water.

28. The method according to claim 12, wherein the second corrosion inhibitor comprises about 0.01 to about 0.50 wt. % of benzotriazole or 5-methyl-1-benzotriazole and deionized water.

29. The method of claim 1, wherein applying a second corrosion inhibitor in situ to the substrate disposed on the platen comprises treating the substrate surface with the second corrosion inhibitor while removing or separating the wafer from the polishing platen.

30. The method of claim 12, wherein applying a second corrosion inhibitor in situ to the substrate disposed on the platen comprises treating the substrate surface with the second corrosion inhibitor while removing or separating the wafer from the polishing platen.

* * * * *